United States Patent
Donovan et al.

(10) Patent No.: US 8,577,634 B2
(45) Date of Patent: Nov. 5, 2013

(54) SYSTEMS AND METHODS FOR SYNCHRONIZING SENSOR DATA

(75) Inventors: Mark J. Donovan, Derry, NH (US); Craig S. Petrie, Merrimack, NH (US); Nevenka Kozomora, Manchester, NH (US); Michael C. Doogue, Manhester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 463 days.

(21) Appl. No.: 12/968,353

(22) Filed: Dec. 15, 2010

(65) Prior Publication Data

US 2012/0158335 A1 Jun. 21, 2012

(51) Int. Cl.
G01R 25/00 (2006.01)

(52) U.S. Cl.
CPC .................. *G01R 25/00* (2013.01)
USPC ................................................. 702/79

(58) Field of Classification Search
USPC ................... 702/79, 118, 182–185
See application file for complete search history.

(56) References Cited

U.S. PATENT DOCUMENTS

| | | | |
|---|---|---|---|
| 6,118,186 A * | 9/2000 | Scott et al. .................. 290/40 B |
| 7,366,597 B2 | 4/2008 | Hartrey et al. | |
| 7,717,085 B1 | 5/2010 | Bauerle | |
| 7,761,251 B2 | 7/2010 | Bauerle | |
| 2002/0015389 A1 | 2/2002 | Wastlhuber et al. | |

OTHER PUBLICATIONS

PCT Search Report and Written Opinion of the ISA; dated Mar. 21, 2012; for PCT Pat. App. No. PCT/US2011/052861; 14 pages.
"3-Axis Digital Compass IC, HMC5883L;" Honeywell Advanced Information; XP-002671326; Oct. 2010; 18 pages.
"Digital Temperature Sensor with I²C™ Interface;" Burr-Brown Products from Texas Instruments; TMP100, TMP101; XP-002671327; Jan. 2002—revised Nov. 2007; Package Option Addendum dated Aug. 20, 2011; 19 pages.
"Single Edge Nibble Transmission for Automotive Applications;" SAE International; Surface Vehicle Information Report; SAE J2716JAN2010; XP-008149400; dated Apr. 2007, revised Jan. 2010; pp. 1-56.
"The I²C Bus Specification;" Version 2.1; Philips Semiconductors; XP-002590803; Jan. 2000; pp. 1-46.
"TMS320x281x, 280x DSP Serial Peripheral Interface (SPI) Reference Guide;" Texas Instruments; Literature No. SPRU059B; XP-002369243; dated Jun. 2002, revised Nov. 2004; 50 pages.
Sae J2716, Surface Vehicle Information Report, (R) SENT—Single Edge Nibble Transmission for Automotive Applications, SAE International, Issued Jan. 2007, Revised Jan. 2010, 56 pages.
International Preliminary Report on Patentability dated Jun. 27, 2013, PCT/US2011/052861, 11 pages.

* cited by examiner

*Primary Examiner* — Edward Raymond
(74) *Attorney, Agent, or Firm* — Daly, Crowley, Mofford & Durkee, LLP

(57) ABSTRACT

A magnetic field sensor including a bidirectional node is configured to perform at least one of generating sensor data, storing sensor data, or communicating sensor data in a serial data signal in response to a trigger signal received at the bidirectional node. An alternative sensor having a node that may or may not be a bidirectional node is configured to reset at least one of a sensor data signal, a clock, a register, or a counter in response to a trigger signal received at the node and is further configured to communicate the sensor data signal in response to the trigger signal.

27 Claims, 9 Drawing Sheets

SYSTEMS AND METHODS FOR SYNCHRONIZING SENSOR DATA

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to systems and methods for synchronizing sensor output data in response to a received trigger signal.

BACKGROUND OF THE INVENTION

Sensors are used to monitor various parameters of a system. For example, in vehicle systems, parameters such as current, speed, angle, linear position, and rotational direction of an article associated with a control module, such as a power steering module, a fuel injection module, and an anti-lock brake module, are often monitored. The sensor output signal is provided to a system controller, such as an Engine Control Unit (ECU), that processes the sensor output signal and may generate a feedback signal for desired operation of the control module.

Conventionally, the sensor updates the sensed parameter periodically and the controller polls the sensor for data as needed for processing. However, as controllers operate at faster speeds, in many cases considerably faster than the sensor, it becomes advantageous for the controller to synchronize the sensor output data transmission so that the newest available data is provided for use by the controller.

SUMMARY OF THE INVENTION

According to one aspect of the present invention, a sensor having a bidirectional node is configured to communicate sensor data in a serial data signal at the bidirectional node in response to a trigger signal received at the bidirectional node. Also described is a method for synchronizing sensor output data including sensing a characteristic with a sensor and generating sensor data indicative of the characteristic and communicating the sensor data in a serial data signal at the bidirectional node in response to the trigger signal received at the bidirectional node.

With these arrangements, communicating sensor data is controlled by a trigger signal received at the bidirectional node, which is the same node at which the sensor output data is provided. Sensor data transmission synchronization in this manner can reduce sensor output data latency and also reduces the number of sensor connections otherwise required to permit receipt of an external synchronization signal by the sensor. And a reduced pin count not only reduces cost and circuit area, but also reduces effects of electromagnetic interference (EMI).

These arrangements may further include storing the sensor data in response to the trigger signal received at the bidirectional node. By synchronizing both the data storing function and the output data transmission function in this manner, ambiguities in the age of the sensor output data can be reduced or eliminated.

Embodiments of the invention may include one or more of the following features. The serial data signal may have a unidirectional signal format such as Single-Edge Nibble Transmission (SENT), Peripheral Sensor Interface 5 (PSI5) and Serial Peripheral Interface (SPI). The serial data signal may include an inactive transmission portion and the trigger signal may be provided during the inactive transmission portion. The serial data signal may be in the form of a serial binary signal or a pulse width modulated (PWM) signal.

In some embodiments, the sensor is configured to store sensor data and to communicate the stored sensor data in the serial data signal in response to detection of a common feature of the trigger signal. For example, the sensor may store the sensor data and communicate the stored sensor data in response to detection of a predetermined edge direction of the trigger signal. Thus, this arrangement results in common control of both the storing and data communication functions by the trigger signal.

In other embodiments, the sensor is configured to store sensor data in response to detection of a first feature of the trigger signal (e.g., edges of a first direction) and is configured to communicate the stored sensor data in the serial data signal in response to detection of a second feature of the trigger signal (e.g., edges of a second, opposite direction), resulting in independent control of the storing and data communication functions by the trigger signal. Such independent control may be particularly advantageous in systems in which a plurality of redundant sensors are used to sense the same parameter, since it may be desirable of have the sensors store the sensor data at the same time, but communicate the stored sensor data at different times as best suited for processing by the controller.

According to a further aspect of the invention, a sensor having a node is configured to reset at least one of a sensor data signal, a clock, a register, or a counter in response to a trigger signal received at the node. The sensor is further configured to communicate the sensor data signal in response to the trigger signal received at the node. In this embodiment, the sensor node may or may not be bidirectional node.

Resetting sensor processing circuitry and/or signals in response to the trigger signal can be advantageous in systems containing multiple sensors in order to ensure that each sensor simultaneously processes an input, such as a magnetic field. Illustrative systems of this type include redundant sensor systems and systems in which multiple sensors are necessary to process an input, such as a direction detection system including multiple spaced sensors to detect a rotational direction and a Circular Vertical Hall (CVH) sensor system in which output signals from multiple CVH sensor die are used to determine the magnetic field angle. Also, use of the trigger signal for resetting the sensor can shorten the latency to receive new sensor data.

In accordance with yet a further aspect of the invention, a magnetic field sensor having a bidirectional node is configured to perform at least one of (i) generating sensor data, (ii) storing sensor data, (iii) resetting at least one of a sensor data signal, a clock, a register, or a counter, or (iv) communicating sensor data in a serial data signal in response to a trigger signal received at the bidirectional node. With this arrangement, the number of sensor connections otherwise required to permit receipt of an external synchronization signal is reduced and the trigger signal can be used to synchronize one of more of the sensor functions of generating sensor data, storing sensor data, resetting the sensor, or communicating the sensor data.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
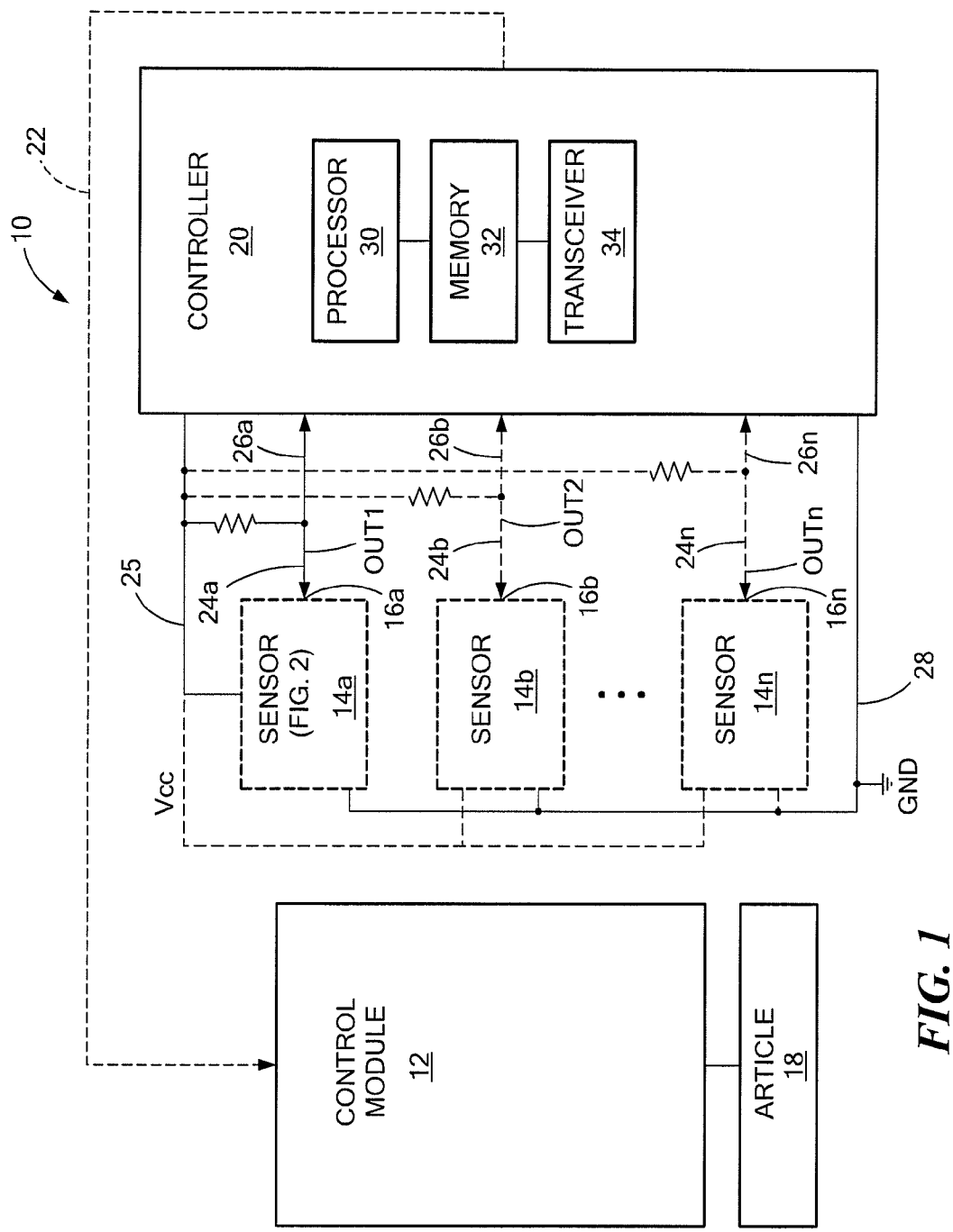
FIG. 1 is a block diagram showing a closed loop sensor system with one or more sensor functions synchronized by a trigger signal received at a bidirectional node of the sensor.

Referring to FIG. 1, a system 10 includes a sensor 14a for sensing a parameter associated with an article 18 that may be controlled by a control module 12. The sensor 14a has a bidirectional node 16a and is configured to generate, update, and optionally store (e.g., latch) sensor data and also to communicate sensor data to a system controller 20 in a serial data signal 26a. Transmission of the serial data signal 26a, and in some embodiments also storing the sensor data, occur in response to a trigger signal 24a received at the bidirectional node. The sensor generated serial data signal 26a and the controller generated trigger signal 24a are carried on a common communication bus OUT1, coupled between the sensor bidirectional node 16a and the controller. The sensor 14a is further coupled to the controller 20 via a power, or Vcc connection 25 and a ground connection 28, as shown. The controller 20 may provide a feedback signal 22 to the control module 12 for use in controlling the article 18.

With this arrangement, communicating sensor data is synchronized by the trigger signal 24a received at the bidirectional node 16a, which is the same node at which the sensor output data is provided in the serial data signal 26a. Sensor data synchronization in this manner can reduce sensor output data latency and also reduces the number of sensor connections otherwise required to permit receipt of an external synchronization signal by the sensor. A reduced pin count not only reduces cost and circuit area, but also reduces effects of electromagnetic interference (EMI). In some embodiments in which both the data storing function and the output data transmission function are synchronized in this manner, ambiguities in the age of the sensor output data can be reduced or eliminated.

The sensor 14a may sense various parameters of an article 18, including, but not limited to current, speed, angle, linear position, and rotational direction. For example, the control module 12 may be a vehicle power steering module, in which case the article 18 may be a magnet associated with the steering unit and the sensor 14a may sense the strength of a magnetic field associated with the magnet for use by the controller 20 to determine an angle of the wheel or steering column. In another example, the control module 12 may be a fuel injection module in which case the article 18 may be a camshaft gear and the magnetic field strength associated with the gear can be sensed by the sensor 14a and used by the controller to determine the speed of rotation and/or the rotational position of the gear. More generally however, the sensor 14a senses a characteristic associated with the article, such as magnetic field strength in the illustrative embodiments, and the controller 20 processes the sensor output data to arrive at the desired parameter information, such as speed or direction of rotation. It will be appreciated by those of ordinary skill in the art that the concepts described herein have applicability to various systems, sensors, articles, control modules, sensed characteristics, and parameters, including closed loop systems as shown and open loop systems.

The controller 20 may take various forms depending on the sensor system 10 and its application. For example, in the case of a vehicle system, the controller 20 may be an Engine Control Unit (ECU) that includes a processor 30, a memory 32, and a transceiver 34 for controlling various aspects of vehicle safety and operation.

According to an aspect of the invention, the serial data signal 26a provided by the sensor 14a at the sensor bidirectional node 16a has a standard unidirectional signal format. Suitable unidirectional signal formats include Single-Edge Nibble Transmission (SENT), Serial Peripheral Interface (SPI), and Peripheral Serial Interface 5 (PSI5). In the illustrative embodiment, the serial data signal 26a is in the SENT format as defined by a Society of Automotive Engineers (SAE) J2716 Specification which is hereby incorporated by reference in its entirety and as described generally in connection with FIG. 3.

The system 10 may include a plurality of sensors 14a-14n, each of which may be of the general configuration described herein for illustrative sensor 14a. Thus, each sensor 14a-14n has a bidirectional node 16a-16n and is configured communicate sensor data in a serial data signal 26a-26n at the respective bidirectional node 16a-16n in response to a respective trigger signal 24a-24n received at the respective bidirectional node 16a-16n. The sensors may additionally store the sensor data in response to the trigger signal. Communication buses, OUT1, OUT2, . . . OUTn, may be coupled between the sensor 14a-14n and the controller 20. Each sensor 14a-14n is further coupled to the controller 20 via the Vcc connection 25 and the ground connection 28, as shown.

Each of the sensors 14a-14n may sense the same characteristic of a single article 18 associated with a single control module 12 as may be desirable for redundancy or in sensor systems in which multiple sensors are necessary to provide the desired data, such as for direction detection and angle detection with multiple CVH sensor die. Alternatively, each sensor 14a-14n may sense a different characteristic associated with the same or different articles, which articles are associated with the same or with different control modules.

As noted above and described below, the sensor data is communicated in a serial data signal (e.g., 26a) in response to detection of a trigger signal (e.g., 24a) received at the bidirectional node (e.g., 16a) and optionally is additionally stored in response to detection of the trigger signal. In embodiments in which both sensor data storing and transmission functions occur in response to the trigger signal, the data storing and data communication functions may occur in response to detection of same feature of the trigger signal 24a, resulting in common control of the storing and data communication functions by the trigger signal 24a. Alternatively, the sensor data may be stored in response to detection of a first feature of the trigger signal 24a and the stored data may be communicated in the serial data signal 26a in response to detection of a second feature of the trigger signal 24a, resulting in independent control of the storing and data communication functions by the trigger signal 24a. Such independent control functions may be particularly advantageous in systems in which a plurality of sensors are used (e.g., for redundancy) to sense the same parameter, since it may be desirable to have all of the sensors store the sensor data at the same time, but communicate the stored sensor data at different times as best suited for processing by the controller.

Figure 2:
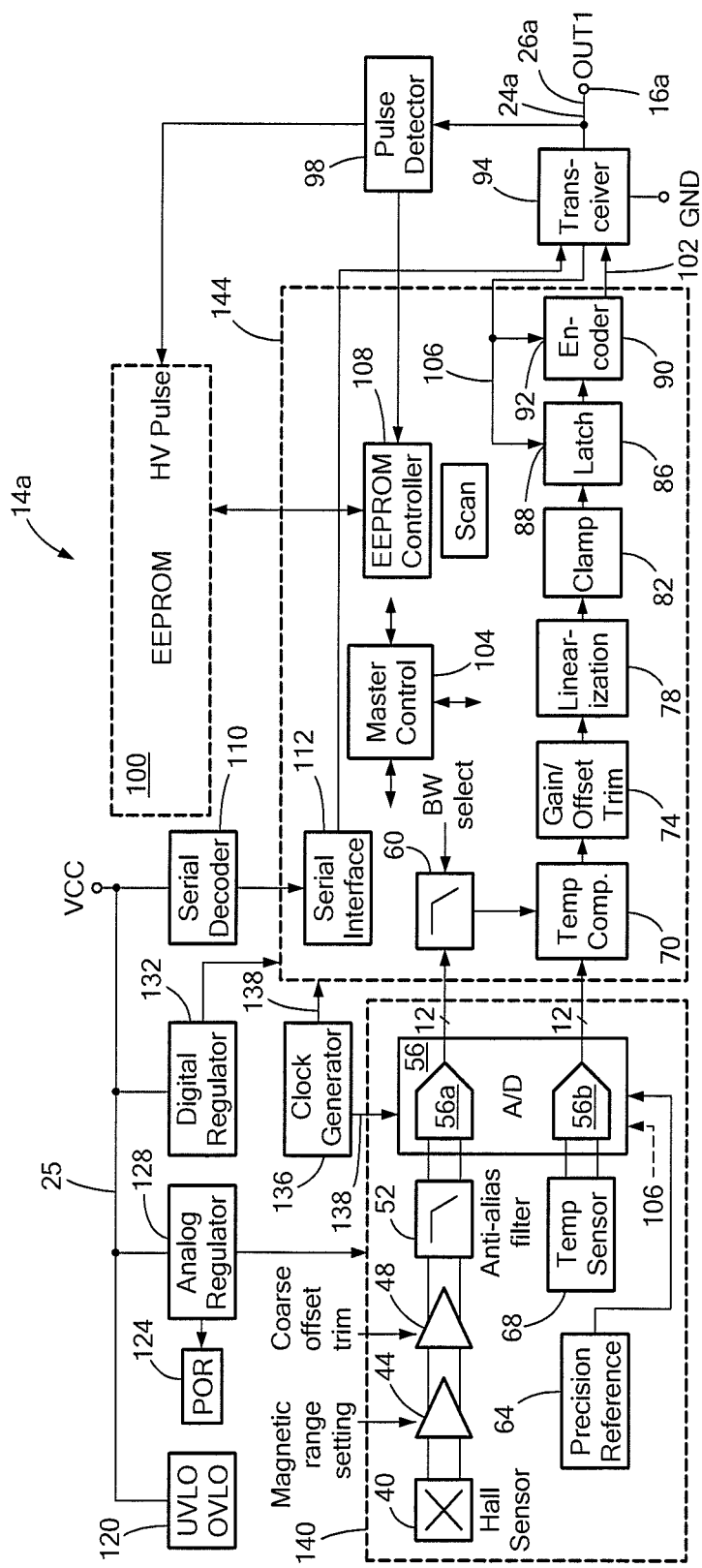
FIG. 2 is a block diagram showing a magnetic field sensor suitable for use in the sensor system of FIG. 1.

Referring also to FIG. 2 in which like elements are labeled with like reference characters, an illustrative sensor 14a includes a sensing element 40, here a magnetic field sensing element, such as a Hall effect element. Other types of magnetic field sensing elements such as magnetoresistive elements (for example a giant magnetoresistance (GMR) element, an anisotropic magnetoresistance element (AMR), a tunneling magnetoresistance (TMR) element, an Indium antimonide (InSb) sensor, a Gallium Arsenide (GaAs) sensor, and magnetic tunnel junction (MTJ) devices) are also suitable. Furthermore, the sensing element 40 may sense other types of characteristics such as temperature, pressure, etc. The sensing element 40 may be a single ended or differential arrangement and may include one or more individual sensing elements in various known configurations.

The magnetic field sensing element 40 is coupled to interface signal processing circuitry which may include one of more of the following circuits and which generates sensor data that is provided to the controller 20 (FIG. 1) via the serial data signal 26a. An amplifier 44 allows for setting the magnetic field range to be sensed and a further amplifier 48 may permit a course adjustment of the offset. In one illustrative embodiment, the magnetic field range may be selected to be between approximately +/−100 Gauss to +/−2250 Gauss. Offset refers to the degree to which the sensed magnetic field signal (i.e., the output of the sensing element 40) is centered at zero magnetic field. An output of the amplifier 48 is filtered, here by an anti-aliasing filter 52, to provide a filtered signal to an analog-to-digital (A/D) converter 56 that receives a precision reference voltage from reference 64 and a clock signal 138 from a clock generator 136, as shown. Here, the A/D converter 56 includes a first converter 56a configured to provide a 12-bit output indicative of the level of the sensed magnetic field to a further filter, here a low pass filter 60.

The sensor 14a may include a temperature compensation circuit 70 to compensate the sensed magnetic field signal for changes due to temperature. To this end, a temperature sensor 68 senses an ambient temperature of the sensor 14a and provides an analog signal indicative of the temperature to an A/D converter 56b, as shown. Converter 56b provides, for example, a 12-bit output signal indicative of the ambient temperature to the temperature compensation circuit 70. In the illustrative embodiment, the temperature compensation circuit 70 implements a polynomial fit of the temperature signal from converter 56b to a temperature correction equation in order to cancel the deleterious effects of temperature variations on device sensitivity and offset, where sensitivity refers to a change in output signal level per change in Gauss level.

An output of the temperature compensation circuit 70 is coupled to a gain/offset trim circuit 74 which may employ various conventional techniques for gain and offset adjustment. A linearization circuit 78 is used to linearize the sensor output in response to non-linear magnetic fields. To this end, the output signal range is divided into a predetermined number of segments, such as thirty-two equal segments, and the linearization circuit 78 applies a linearization coefficient factor to each segment. The linearization coefficients may be stored in a look-up table in an EEPROM as described in a co-pending U.S. patent application Ser. No. 12/902,410 entitled Magnetic Field Sensor and Method Used in a Magnetic Field Sensor that Adjusts a Sensitivity and/or an Offset Over Temperature filed on Oct. 12, 2010 and assigned to the Assignee of the subject application. A clamp 82 coupled to the output of the linearization circuit 78 permits signal limiting and provides digital sensor data thus processed to the latch 86.

A latch 86 receives and stores (i.e., latches) digital sensor data from the interface circuitry. The latch 86 may be responsive to a trigger signal (e.g., 24a, FIG. 1) received at the bidirectional node 16a to cause the digital sensor data to be stored. More particularly, a buffered version of the trigger signal 24a (i.e., signal 106) is provided to a control node 88 of the latch 86 and contains the buffered trigger signal for detection by the latch 86. In other embodiments, the data is stored by the latch 86 independently of the trigger signal 24a. An output node of the latch is coupled to an encoder 90, as shown.

The encoder 90 is configured to communicate the sensor data, here digital sensor data, in the serial data signal 26a at the bidirectional node 16a in response to the trigger signal 24a received at the bidirectional node 16a. In the illustrative embodiment, the serial data signal 26a has a standard unidirectional signal format and, in particular has the SENT format. More particularly, signal 106 provided by the transceiver to a control node 92 of the encoder contains the trigger signal for detection by the encoder. The encoder 90 provides the serial data signal 26a at the bidirectional sensor node 16a via a transceiver 94 (FIG. 4A) as will be described.

In view of the above discussion, it will be apparent that in the illustrative embodiment, the latch 86 stores digital sensor data in response to the trigger signal 24a and the serial data signal 26a is a digital signal. However, it will be appreciated by those of ordinary skill in the art that alternatively, the sensor data may be stored and/or communicated to the controller 20 in analog form, by analog circuitry and techniques accordingly.

It will also be appreciated by those of ordinary skill in the art that the sensor data may not be "stored" in a conventional fashion with a dedicated storage device. In one example, the latch 86 may be eliminated and the trigger signal 24a in the form of buffered signal 106 may be provided to a control node of the A/D converter 56a (as shown in phantom in FIG. 2), in which case generating and/or updating of the sensor data occurs in the A/D in response to the trigger signal 24a, as may be advantageous. Another example of a sensor in which there is no dedicated "storing" circuitry or function is described in connection with FIGS. 7, 7A, and 8.

The sensor 14a includes an EEPROM 100 in which programmable registers store user selections for programmable features. Various schemes are suitable for programming communication between the controller 20 and the sensor 14a.

In the illustrative embodiment, a Manchester encoding scheme is used with which the controller 20 sends commands to the sensor 14a via the Vcc connection 25, such as a Write Access Command, a Write Command, and a Read Command. In response to a Read Command, the sensor 14a responds with a Read Acknowledge signal via bus OUT1 that contains the requested data.

A serial decoder 110 translates the Vcc signal level (e.g., having a signal of 5-8 volts) into a logic signal and a serial interface 112 decodes the resulting logic signal into a binary command signal. For example, in the case of a Write Command, the binary command signal at the output of the serial interface 112 indicates to an EEPROM controller 108 the address of the register to be written and the data to be written. A Write Access Command unlocks the device for writing. In the case of a Read Command, the binary signal output of the serial interface 112 presents the contents of the selected register to the transceiver for communication at the bidirectional node 16a.

In order to write to the EEPROM, the controller 20 (FIG. 1) sends a Disable Output Command to put the bidirectional node 16a into a high impedance state. The controller 20 also sends high voltage pulses to the sensor in order to boost the voltage on the EEPROM gates. To this end, a pulse detector 98 is coupled to the bidirectional node 16a and to the EEPROM controller 108. After writing is complete, the controller 20 sends an Enable Output Command to bring the bidirectional node 16a from its high impedance state to a value indicative of the sensed magnetic field. Preferably, the bidirectional node 16a is also put into a high impedance state before a Read Command is sent until after the Read Acknowledge signal is returned.

Various features of the sensor 14a are programmable in the above-described manner, including but not limited to the magnetic field range via amplifier 44, the course offset trim via amplifier 48, the bandwidth via filter 60, etc. According to the invention, a sensor data communication mode is also programmable. Specifically, the sensor 14a can be programmed to dictate whether the sensor data is communicated to the controller in a conventional manner (independent of any synchronization by the controller) or according to the invention (in response to receipt of the trigger signal 24a from the controller 20 at the sensor bidirectional node 16a). Additional programmable features relate to the SENT signal format as described below.

Additional features of the sensor 14a may include an undervoltage/overvoltage lockout circuit 120 and a power-on reset (POR) circuit 124. The undervoltage/overvoltage lockout circuit 120 senses the voltage level of the $V_{CC}$ signal 25, sending an error signal to the Master Control block 104 if a predetermined range is exceeded. The POR circuit 124 pauses critical circuitry upon power-up until $V_{CC}$ reaches an appropriate voltage level.

The sensor 14a may be provided in the form of an integrated circuit, here with an analog front-end portion 140 and a digital subsystem 144. An analog voltage regulator 128 provides a regulated voltage to the analog front-end 140 and a digital regulator 132 powers the digital subsystems 144, as shown. Clock generator 136 provides clock signals to the A/D converter 56 and to the master controller 104. It will be appreciated by those of ordinary skill in the art however, that the particular delineation of which circuit functions are implemented in an analog fashion or with digital circuitry and signals can be varied. Also circuit functions that are shown to be implemented on the integrated circuit sensor 14a can be accomplished on separate circuits (e.g., additional integrated circuits or circuit boards).

Figure 3:
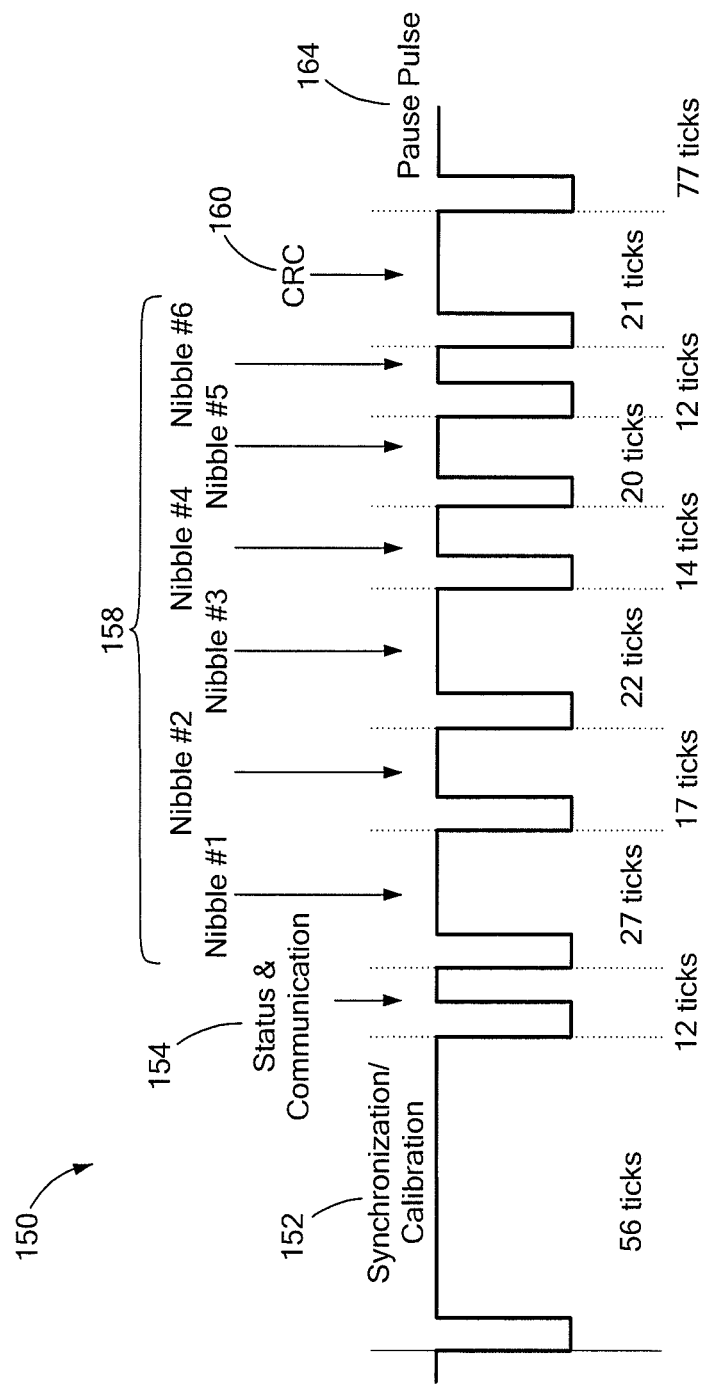
FIG. 3 is a timing diagram showing the SENT signal format.

Referring also to FIG. 3, the serial data signal 26a communicated by the sensor 14a may have a standard unidirectional signal format, such as the illustrative SENT signal format. A SENT signal 150 consists of a sequence of pulses which is repeatedly sent by the transmitting module (here, the sensor 14a). The SENT 150 signal includes at least four portions: a Synchronization/Calibration portion 152, a Status and Serial Communication portion 154, a Data portion 158, and a Checksum (or cyclic redundancy check, CRC) portion 160. A "tick" refers to the nominal clock signal period and a "nibble" is 4 bits. Each nibble has a specified time for low and high state. The low state duration is by default 5 ticks and the high state duration is dictated by the information value of the nibble. The Synchronization/Calibration portion 152 identifies the start of the SENT message and always has a pulse duration of 56 ticks. Status and Serial Communication portion 154 is used to inform the controller 20 of the sensor status or features (such as part numbers or error code information) and has a duration of between 12 and 27 ticks to provide 4 bits. The Data portion 158 includes up to six nibbles of data, with each nibble containing 4 bits with values ranging from 0 to 15. Thus, each data nibble has a pulse duration from 12 to 27 ticks. The number of data nibbles will be fixed for each application but can vary between applications. In order to transmit two 12 bit values, 6 data nibbles are communicated, as shown.

The SENT signal 150 includes an optional pause portion 164 that is used in connection with the invention in order to permit bidirectional communication via the bidirectional sensor node 16a. In general, the pause portion 164 corresponds to a period of inactivity on the output bus, OUT1, (FIG. 1) or in other words, a time when the serial data signal 26a (FIG. 1) is inactive or high. Conventionally, the pause portion 164 is sometimes used to prolong the SENT signal to a constant length if desired. The user can program a particular desired frame rate via the programming scheme as described above. It will be appreciated by those of ordinary skill in the art that inactivity on the output bus, OUT1, may alternatively correspond to a low (pull down) signal level.

According to the invention, the pause portion 164 is used to permit bidirectional communication on the output bus, OUT1, by allowing for the trigger signal 24a received at the sensor bidirectional node 16a during the pause portion to control data functions of the sensor. It will be appreciated by those of ordinary skill in the art that the SENT signal pause portion 164 represents a part of the signal when neither data nor control information is transmitted by the sensor and thus, may be referred to more generally as the inactive transmission portion 164.

Various aspects of the SENT signal format can be user programmed, for example, in the EEPROM 100 of FIG. 2. As examples, a SENT_STATUS parameter can be used to indicate the desired format for the four bit Status and Serial Communication portion 154, a SENT_SERIAL parameter can be used to select a desired format for a serial data signal embedded in successive SENT messages according to the SENT specification, comprising a short serial message format of 8 bits, an enhanced serial message format of 12 bits, or a further enhanced serial message format of 16 bits. A SENT_DATA parameter can be used to specify the particular sensor data to be communicated in the data nibbles. For example, one value of the SENT_DATA parameter may indicate that three data nibbles represent magnetic field data and three data nibbles represent temperature data. A SENT_TICK parameter can used to specify the nominal tick time. A SENT_LOVAR parameter can be used to depart from the SENT standard of having a fixed low state time in each nibble to having the high state time fixed instead. And a SENT_FIXED parameter can be used to depart from the SENT standard by specifying a different defined length of the fixed portion of each nibble.

Figure 4:
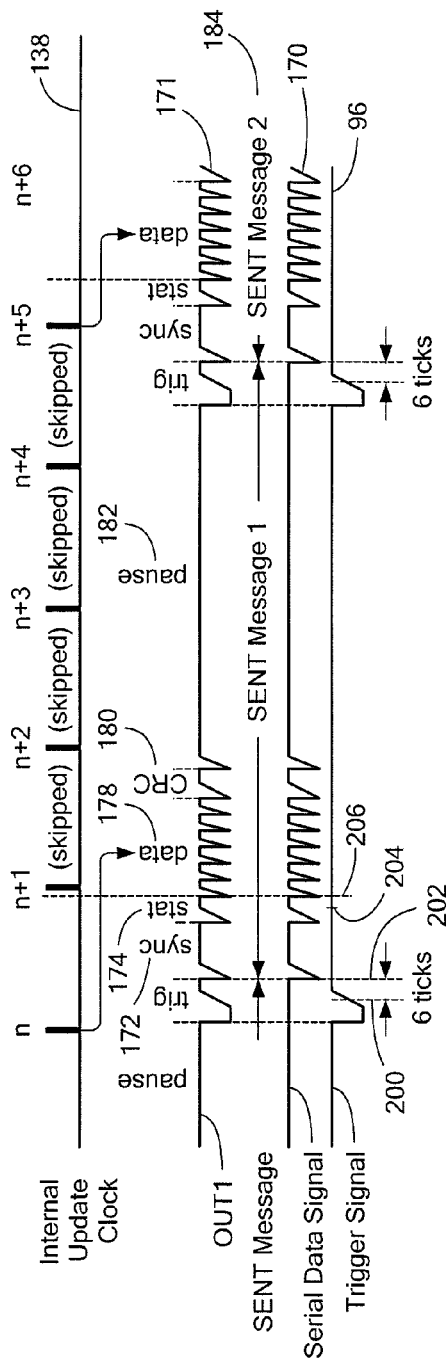
FIG. 4 is a timing diagram showing an illustrative serial data signal and a trigger signal, and the resulting transmission signal associated with one mode of data transmission according to the invention.
Figure 5:
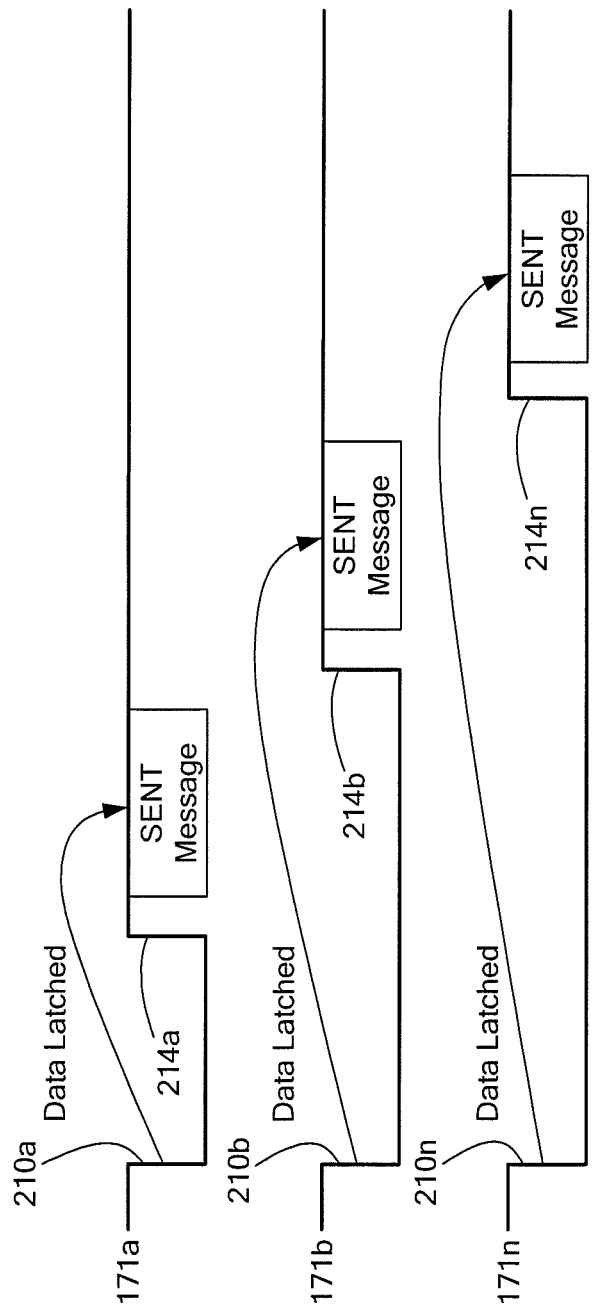
FIG. 5 is a timing diagram showing a plurality of transmission signals associated with a plurality of sensors of FIG. 1 to illustrate the timing of sensor data storing and transmission of the respective serial data signal by each of the sensors under the control of a trigger signal.
Figure 6:
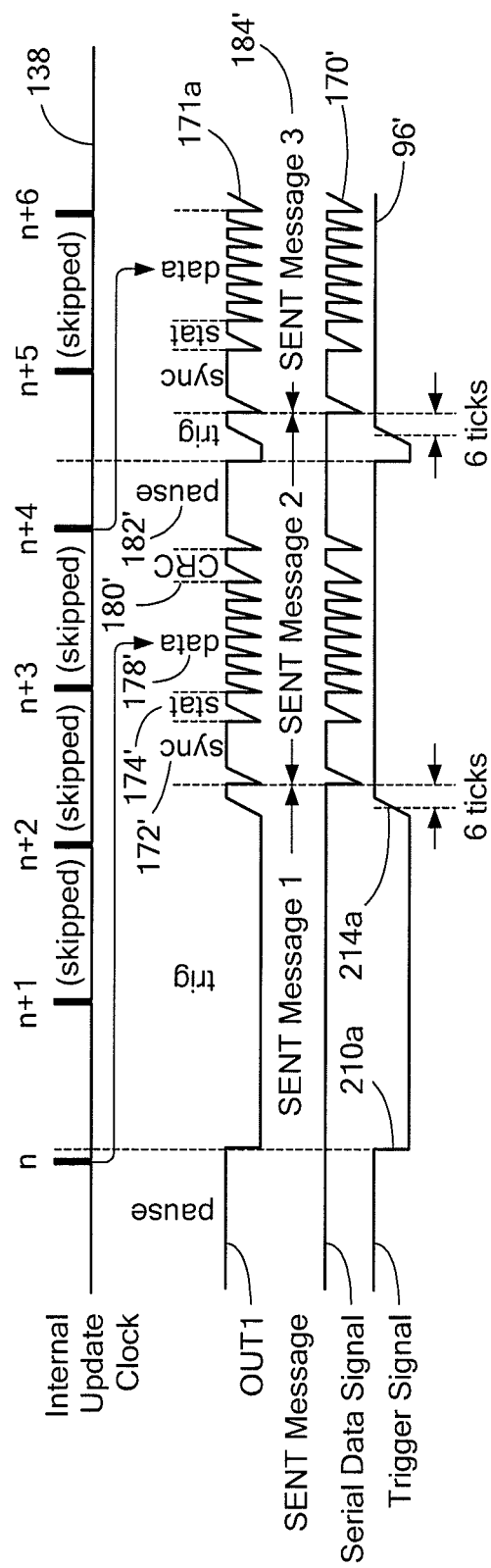
FIG. 6 is a timing diagram showing an illustrative serial data signal and a trigger signal, and the resulting transmission signal associated with an alternative mode of data transmission according to a further aspect of the invention.

A SENT_UPDATE parameter is used to specify a desired data communication mode. In accordance with one mode of data communication, sensor data is both stored and communicated to the controller 20 (FIG. 1) in response to detection of a common feature of the trigger signal 24a as illustrated in FIG. 4. In another mode of data communication, sensor data is stored in response to detection of a first feature of the trigger signal 24a and is communicated in response to a detection of second feature of the trigger signal 24a, as illustrated in FIGS. 5 and 6. Other data communication modes are also possible, such as a mode in which the trigger signal controls only generating/updating the sensor data (such as via the A/D converter 56 of FIG. 2), a mode in which the trigger signal only controls communication of the serial data signal 26a and any sensor data generating/updating and/or dedicated sensor data storage occurs independently of the trigger signal, a mode in which the trigger signal resets certain sensor circuitry (such as clock generator 136, registers, or counters) as will be described in connection with FIGS. 7, 7A, and 8, a mode in which any combination of these sensor functions is controlled by the trigger signal, or a mode in which the serial data signal 26a does not include the optional pause portion 164. For example, while the data communication modes illustrated in FIGS. 4 and 6 have the sensor data being both stored and also the stored data being communicated under the control of the trigger signal, the trigger signal may, alternatively, control only one such function (data storing or communication) or any combination of sensor data storing, updating, resetting and transmitting functions.

Referring also to FIG. 4 in which like elements are labeled with like reference characters, exemplary signals associated with the sensor 14a are shown in accordance with the data communication mode in which sensor data is both stored and communicated to the controller 20 in response to detection of a common feature of a trigger signal 96 received at the bidirectional node 16a. In particular, an illustrative serial data signal 170 of the type provided by the sensor 14a at its bidirectional output node 16a in response to receipt of a trigger signal 96 at the bidirectional node 16a is shown. Here, the serial data signal 170 is in the SENT format (FIG. 3). Thus, a composite signal 171 contains both the trigger signal 96 and the serial data signal 170 including a Synchronization/Calibration portion 172 (like portion 152 of FIG. 3), a Status and Serial Communication portion 174 (like portion 154 of FIG. 3), a Data portion 178 (like portion 158 of FIG. 3) and a CRC portion 180 (like portion 160 of FIG. 3). A pause portion 182 (like portion 164 of FIG. 3) follows the CRC portion 178. Also shown in FIG. 4, is a block representation 184 that indicates the delineation between consecutive SENT messages (e.g., SENT message 1 and SENT message 2).

The controller 20 provides the trigger signal 96 in a low state (i.e., pulls down on the output bus OUT1) when it is desired to initiate sensor data storing and communication operations, as will be described.

Figure 4A:
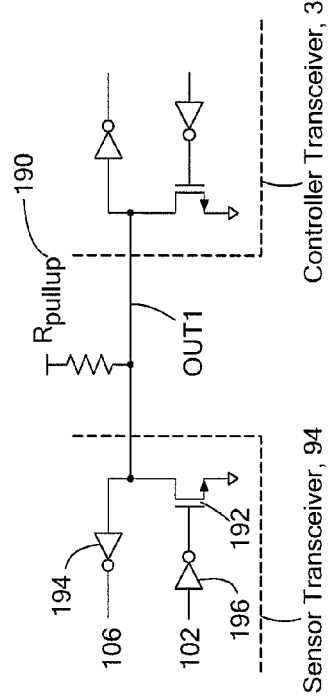
FIG. 4A shows a circuit configuration for a portion of a sensor transceiver and a controller transceiver.

Referring also to FIG. 4A in which like elements are labeled with like reference characters, a portion of the sensor transceiver 94 and controller transceiver 34 within the controller 20 are shown with output bus, OUT1, connecting the transceivers. In this embodiment, a pull up resistor 190 is coupled to the output bus, OUT1, so that the default signal level is a logic high level until one of the transceivers 34, 94 pulls down on the bus. To this end, the sensor transceiver 94 includes a transistor 192 having a control node coupled to an output of an inverter 196 and an output node coupled to the output bus, OUT1. A further inverter 194 is coupled between the output bus, OUT1, and the latch control node 88 and encoder control node 92. The controller transceiver 34 is shown to be of the same general topology as the sensor transceiver 94 and thus, pulls down on the output bus OUT1 with an open drain arrangement in order to provide the trigger signal (e.g., 96). It will be appreciated by those of ordinary skill in the art however, that the transceivers 34, 94 can take various forms suitable for providing signal driving and buffering capability.

Transmission of the serial data signal 170 by the sensor 14a and transmission of the trigger signal 96 by the controller 20 result in the composite transmission signal 171 on the output bus, OUT1. Thus, composite transmission signal 171 contains the portions of both the serial data signal 170 and the trigger signal 96, as shown.

Clock signal 138 (FIG. 4) illustrates times (i.e., n, n+1, n+2, . . . ) when the sensor data is updated internally to the sensor. In the illustrative embodiment, these times correspond to times when the analog magnetic field signal is converted to a digital signal by the A/D converter 56a (FIG. 2).

The controller 20 provides the trigger signal 96 during the pause portion 182 by pulling down on the bus, OUT1. In data transmission mode illustrated in FIG. 4, the sensor 14a responds to receipt of the trigger signal 96 during the pause portion by storing sensor data and thereafter communicating the stored sensor data in the serial data signal 170 and, more particularly, stores and communicates the sensor data in response to detection of a common feature of the trigger signal.

In the illustrative embodiment, the common feature is a rising edge of the trigger signal 96 following the trigger signal being low for a minimum of one tick time. Stated differently, in this embodiment, an effective trigger signal is defined as the output bus, OUT1, being pulled low for a minimum of one clock tick. More generally however, the feature can be a predetermined edge direction of the trigger signal, one or more signal pulses (i.e., detection of first and second, opposite edge directions), multiple edge detections of the same or different directions within a predetermined duration, or any other suitable feature.

In response to detection of the rising edge of the trigger signal 96 (i.e., here at time 200), the sensor 14a waits a predetermined time (i.e., a predetermined number of ticks, such as 6 ticks) as occurs here at time 202, and then begins transmission of the next SENT message. In the illustrative embodiment, 6 ticks was chosen so that the trigger signal 96, whose ending time is determined by the sensor, is approximately equal to the shortest possible SENT pulse (12 ticks). This assumes that the controller chooses a low time of approximately 6 clock ticks. Faster pulses create more EMI, and slower pulses delay transmission.

Advantageously, the sensor data is not stored until the last possible time before transmission of the data portion 178 in order to ensure that the controller receives the newest possible sensor data. In the illustrative embodiment, the sensor data is stored a few microseconds before the data portion 178 is transmitted, as indicated at time 204 and the data portion 178 is communicated thereafter at time 206. Thus, the sensor 14a stores the sensor data starting at a first predetermined time 204 after detection of the common trigger signal feature and communicates the stored sensor data in the serial data signal 170 starting at a second predetermined time 206 after detection of the common feature.

Referring briefly also to FIGS. 2 and 4A, the trigger signal 96 is coupled to the latch control node 88 and also to the encoder control node 92 via the inverter 194 and the signal 106. The latch 86 detects the rising edge of the trigger signal 96 and stores received sensor data at time 204 (e.g., at 6 ticks minus 2 us after detection of the rising edge at time 202). The encoder 90 likewise detects the rising edge of the trigger signal 96 and begins communication of the next SENT message at a predetermined time thereafter, here at time 202, and communicates the stored sensor data in data portion 178 at a further predetermined time after detection of the rising edge, here at time 206.

Referring also to FIG. 5, an alternative mode of data communication, in which sensor data is stored in response to detection of a first feature of a trigger signal received at the sensor bidirectional node and is communicated to the controller in response to a detection of a second feature of the trigger signal, is illustrated. FIG. 5 shows a plurality of composite transmission signals 171a, 171b, ... 171n in connection with a sensor system 10 containing n sensors 14a, 14b, ... 14n, respectively (FIG. 1). Each sensor 14a-14n is responsive to a first feature 210a-210n, shown in FIG. 5 as a falling edge, of a respective received trigger signal 96a-96n for storing sensor data and to a second feature 214a-214n, shown in FIG. 5 as a rising edge, of the respective received trigger signal for transmitting the stored sensor data in a serial data signal.

Illustrative composite signal 171a is shown in greater detail in FIG. 6 along with a block representation 184' showing the delineation between consecutive SENT messages (e.g., SENT message 1 and SENT message 2), a serial data signal 170' provided by the sensor 14a (and including portions 172', 174', 178', and 182' like similar portions of the signal shown in FIG. 4), a trigger signal 96' provided by the controller 20 at the sensor bidirectional node, and the internal clock signal 138 that shows times at which the sensor data is updated (i.e., n, n+1, n+2, ... ).

The sensor 14a detects the first feature 210a of the trigger signal, here a falling edge, and stores the sensor data in the latch 86 in response. The sensor further detects the second feature 214a of the trigger signal, here a rising edge, and begins communication of the serial data signal as a result. More particularly, here the sensor communicates the serial data signal 170' at a predetermined time following detection of the second trigger signal feature, such as 6 clock ticks following detection. Thus, the sensor stores the sensor data upon detection of a falling edge of the trigger pulse during the pause portion and transmits the serial data signal 170' at a predetermined time after detection of a rising edge of the trigger signal during the pause portion. As described above in conjunction with the trigger signal shown in FIG. 4, while the trigger signal features used in this embodiment are signal edges of a particular direction, various other signal features would alternatively be used, including but not limited to one or more signal pulses (i.e., detection of first and second, opposite edge directions), multiple edge detections of the same or different directions, etc.

Figure 7:
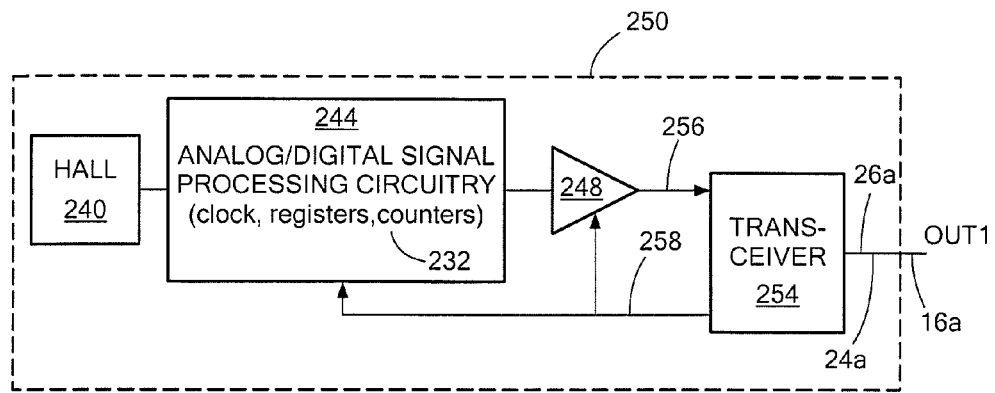
FIG. 7 is a block diagram showing an alternative sensor having the trigger signal coupled to reset sensor circuitry.

Referring also to FIG. 7, an alternative sensor 250 for use in the sensor system of FIG. 1 is shown in simplified form to include a magnetic field sensing element 240, such as a Hall element, providing a magnetic field signal to signal processing circuitry 244. The signal processing circuitry 244 may include various circuitry shown and described in connection with FIG. 2 and may include other conventional magnetic field signal processing circuitry. The circuitry 244 generally includes at least one of a clock circuit, a register and/or a counter 232 for processing the magnetic field signal to provide sensor data to an output stage 248. For example, circuitry 244 may include a clock circuit like clock generator 136 of FIG. 2. The output stage 248 provides a data signal 256 (which may be like signal 106 of FIG. 2) to a transceiver 254 (which may be like transceiver 94 of FIG. 2) which provides a buffered version 258 of the trigger signal 24a (like signal 106 of FIG. 2). Here however, the trigger signal version 258 is coupled to reset or clear at least one of a clock, register, counter (collectively 232) or the output stage 248 of the sensor. The term "reset" is used herein to refer to placing the sensor or sensor circuitry into a known state and may be referred to interchangeably as setting, resetting, or clearing the circuitry.

Figure 7A:
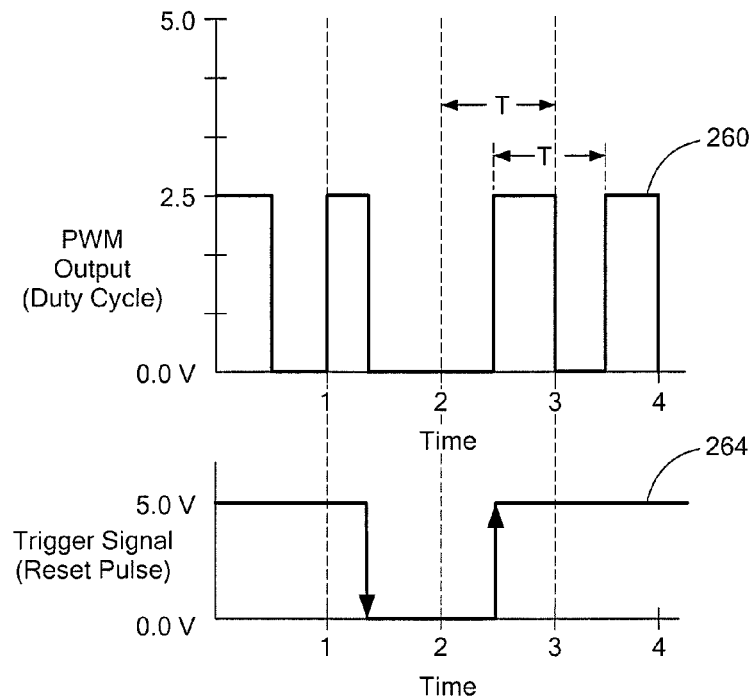
FIG. 7A is a timing diagram showing an illustrative PWM signal and a trigger signal to illustrate resetting of sensor by the trigger signal.

The serial data signal 26a may be in the form of a binary signal (such as in the case of a SENT signal as described above) or alternatively may be in the form of a Pulse Width Modulated (PWM) signal in which the data value is conveyed by the duty cycle of the signal. One embodiment of the sensor system 10 (FIG. 1) in which the sensors 14a-14n take the form of sensor 250 with the trigger signal 24a coupled to reset the sensor and in which the serial data signal is a in PWM format, is illustrated by the waveforms of FIG. 7A (in which like elements are labeled with like reference characters). More particularly, FIG. 7A shows an illustrative data signal 256 in the form of PWM signal 260 and also shows an illustrative trigger signal 264, here functioning as a reset pulse. In this example, assertion of the trigger signal 264 (here shown to be an active low signal with assertion occurring at approximately time=1.3) resets the signal processing circuitry 244 of the sensor 250 so as to terminate the PWM signal 260. Deassertion of the trigger signal 264 (here occurring at time=2.5) causes the substantially immediate transmission of new sensor output data as is shown by the PWM signal 260. With this arrangement, the latency for the controller to receive fresh sensor data can be shortened.

Another example of the benefit of using the trigger signal to reset the sensor is in systems in which multiple sensors are necessary to process an input to arrive at a desired output, such as a CVH sensor system in which multiple circularly positioned sensors process the magnetic field to determine the magnetic field angle. Resetting multiple CVH sensor die in a multi-chip system can ensure that these asynchronously clocked die are reset to measure the magnetic field at essentially the same time.

Figure 8:
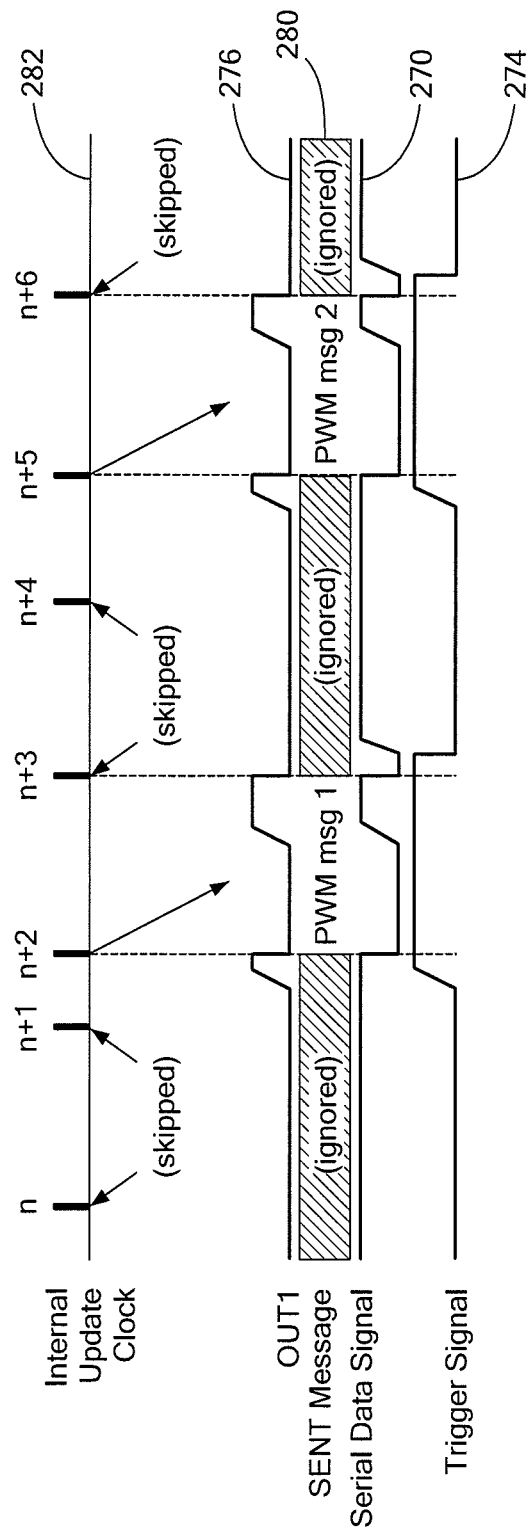
FIG. 8 is a timing diagram showing an illustrative serial data signal and trigger signal, and the resulting transmission signal associated with another alternative mode of data transmission according to a further aspect of the invention.

Referring also to FIG. 8, exemplary signals associated with the sensor 250 are shown in accordance with a data communication mode in which sensor is reset and new sensor data is communicated to the controller 20 as a serial data signal in response to a trigger signal received at the bidirectional node 16a. In particular, an illustrative serial data signal 270 of the type provided by the sensor 14a at its bidirectional node 16a in response to receipt of an illustrative trigger signal 274 at the bidirectional node 16a is shown. Here, the serial data signal 270 is a PWM signal. Thus, a composite signal 276 on output bus, OUT1, contains both the trigger signal 274 and the serial data signal 270. Also shown in FIG. 8, is a block representation 280 that indicates the delineation between consecutive sensor messages and a sensor clock signal 282.

The controller 20 pulls down on the output bus, OUT1, until it is ready to reset the sensor and receive new sensor data, at which time (here just before time=n+2) the controller releases the bus so that the bus goes high. In response to detection of the rising edge of the trigger signal 274, the output stage 248 of the sensor is reset to terminate the PWM serial data signal 270 and the sensor clock 282 is reset. The sensor then restarts its internal clock and signal processing circuitry to initiate the next PWM message at time n+2. After the message is completed at time n+3, the controller pulls the output bus, OUT1, low until it is ready to receive another message (just before time n+5 in the example shown). Thus, as is apparent, here the sensor responds to detection of a feature of the trigger signal by resetting its internal clock and the output stage, and initiating the updating and transmission of the PWM message. In this embodiment, the sensor data is continuously generated by the sensor with no dedicated storage or latching necessary and such sensor data is ignored by the controller until the controller releases the output bus, OUT1.

Figure 9:
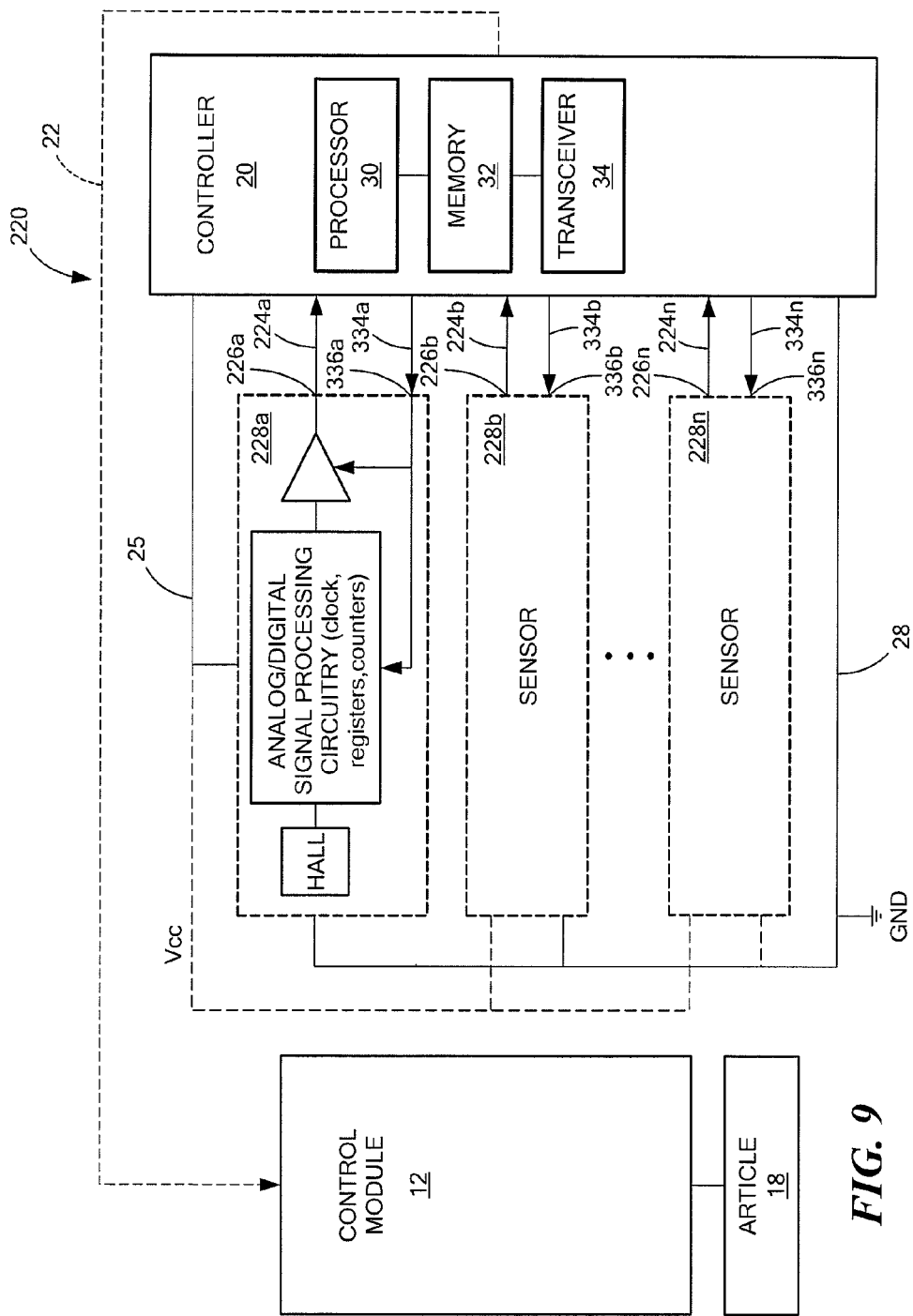
FIG. 9 is block diagram showing a sensor system with one or more sensor functions synchronized by a trigger signal received at a unidirectional node of the sensor.

Referring to FIG. 9, an alternative sensor system 220 is shown in which like elements are labeled with like reference characters. The sensor system 220 includes one or more sensors 228a-228n, for sensing a parameter associated with the article 18. The controller 20 receives data signals 224a-224n representative of the sensed parameter from sensors 228a-228n, respectively, and provides an optional feedback signal 22 to the control module 12 for control of the article.

Sensors 228a-228n differ from the sensors 14a-14n of FIG. 1 in that sensors 228a-228n do not have a bidirectional node, but rather have unidirectional nodes 226a-226n at which the respective data signals 224a-224n are provided. Each sensor further has a separate, trigger node 336a-336n at which a respective trigger signal 334a-334n is received from the controller 20. Although not shown in FIG. 9 for simplicity, a pull up or pull down resistor is coupled to each of the signal lines 224a-224n and 334a-334n. The data signals 224a-224n contain the sensor output data and may be provided in any form, including but not limited to the SENT format (in which case signals 170 or 170' of FIGS. 4 and 6, respectively, may be representative of such data signals) or a PWM format (in which case signal 270 of FIG. 8 may be representative of such data signals). Trigger signals 336a-336n may also take various forms, including the form of trigger signals 96, 96', and 274 of FIGS. 4, 6, and 8, respectively.

While illustrative sensor 228a is shown for simplicity to be of the same general form as sensor 250 of FIG. 7, sensors 228a-228n may alternatively take the same general form as sensor 14a of FIG. 2 or any combination thereof, such that any of the sensor data functions of generating/updating sensor data, storing sensor data, resetting sensor elements and/or signals, and transmitting sensor data signals to the controller, individually or in any combination, can be controlled by a trigger signal from the controller 20.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used.

For example, it will be appreciated by those of ordinary skill in the art that while the described sensor 14a has multiple programmable data communications modes (e.g., the mode illustrated by FIG. 4 and the mode illustrated by FIGS. 5 and 6), a sensor according to the invention may have only a single bidirectional data communication mode.

It will also be appreciated that while the various signals coupled between the sensors and the controller are shown as point to point connections, the invention is suitable for use with multi-sensor bus systems (e.g., using an $I^2C$ bus and signal protocol).

Accordingly, it is submitted that that scope of the patent should not be limited to the described embodiments but rather should be limited only by the spirit and scope of the following claims. All publications and references cited herein are expressly incorporated herein by reference in their entirety.

What is claimed is:

1. A sensor comprising a bidirectional node, wherein the sensor is configured to communicate sensor data in a serial data signal having a unidirectional signal format at the bidirectional node in response to a trigger signal received at the bidirectional node.

2. The sensor of claim 1, wherein the sensor is configured to store the sensor data in response to the trigger signal.

3. The sensor of claim 2, wherein the sensor is configured to store the sensor data and to communicate the stored sensor data in the serial data signal in response to detection of a common feature of the trigger signal.

4. The sensor of claim 3, wherein the common feature of the trigger signal is a predetermined edge direction.

5. The sensor of claim 3, wherein the sensor is configured to store the sensor data starting at a first predetermined time after detection of the common feature and to communicate the stored sensor data in the serial data signal starting at a second predetermined time after detection of the common feature.

6. The sensor of claim 2, wherein the sensor is configured to store the sensor data in response to detection of a first feature of the trigger signal and is configured to communicate the stored sensor data in the serial data signal in response to detection of a second feature of the trigger signal.

7. The sensor of claim 6, wherein the first feature of the trigger signal is a first predetermined edge direction and wherein the second feature of the trigger signal is a second, opposite edge direction.

8. The sensor of claim 6, wherein the sensor is configured to communicate the stored sensor data in the serial data signal starting at a predetermined time after detection of the second feature of the trigger signal.

9. The sensor of claim 1, wherein the serial data signal format is selected from Single-Edge Nibble Transmission (SENT), Serial Peripheral Interface 5 (SPI5), or Serial Peripheral Interface (SPI).

10. The sensor of claim 1, wherein the serial data signal comprises an inactive transmission portion and wherein the trigger signal is received during the inactive transmission portion.

11. The sensor of claim 1, wherein the sensor is a magnetic field sensor.

12. The sensor of claim 2, further comprising:
  a magnetic field sensing element responsive to a magnetic field associated with an article for providing a magnetic field output signal indicative of the magnetic field;
  an interface circuit coupled to receive the magnetic field output signal and configured to generate the sensor data;
  a latch coupled to the interface circuit and comprising a latch control node and a digital data output node at which latched digital sensor data is provided in response to detection of the trigger signal at the latch control node;
  an encoder coupled to the digital data output node and comprising an encoder control node and a serial data output node; and
  a transceiver coupled to the serial data output node and comprising the bidirectional node, wherein the serial data signal is provided at the bidirectional node in response to detection of the trigger signal at the encoder control node.

13. The sensor of claim 12, wherein the magnetic field sensing element comprises a selected one of a Hall effect element or a magnetoresistive element.

14. The sensor of claim 1, wherein the serial data signal comprises one or more of a serial binary signal and a pulse width modulated (PWM) signal.

15. A method for synchronizing sensor output data comprising the steps of:
   sensing a characteristic with a sensor and generating sensor data indicative of the characteristic; and
   communicating the sensor data in a serial data signal having a unidirectional signal format at a bidirectional node of the sensor in response to a trigger signal received at the bidirectional node.

16. The method of claim 15, further comprising storing the sensor data in response to the trigger signal received at the bidirectional node.

17. The method of claim 16, wherein the storing the sensor data and the communicating the stored sensor data in the serial data signal occur in response to detection of a common feature of the trigger signal.

18. The method of claim 17, further comprising storing the sensor data starting at a first predetermined time after detection of the common feature and communicating the stored sensor data in the serial data signal starting at a second predetermined time after detection of the common feature.

19. The method of claim 16, wherein the storing the sensor data occurs in response to detection of a first feature of the trigger signal and the communicating the stored sensor data in the serial data signal occurs in response to detection of a second feature of the trigger signal.

20. The sensor of claim 19, further comprising communicating the stored sensor data in the serial data signal starting at a predetermined time after detection of the second feature of the trigger signal.

21. The method of claim 15, further comprising receiving the trigger signal from a system controller during an inactive transmission portion of the serial data signal.

22. A sensor comprising a node, wherein the sensor is configured to reset at least one of a sensor data signal, a clock, a register, or a counter in response to a trigger signal received at the node and is further configured to communicate the sensor data signal in response to the trigger signal received at the node.

23. The sensor of claim 22 wherein the node is a bidirectional node and wherein the sensor data signal is provided at the node.

24. The sensor of claim 22 wherein the node is a unidirectional node and wherein the sensor further comprises a second node at which the sensor data signal is provided.

25. The sensor of claim 22 wherein the sensor is configured to reset the at least one of the sensor data signal, the clock, the register, or the counter in response to detection of a first feature of the trigger signal and is configured to communicate the sensor data signal in response to detection of a second feature of the trigger signal.

26. A magnetic field sensor comprising a bidirectional node and configured to perform at least one of (i) generating sensor data, (ii) storing sensor data, (iii) resetting at least one of a sensor data signal, a clock, a register, or a counter, or (iv) communicating sensor data in a serial data signal having a unidirectional signal format in response to a trigger signal received at the bidirectional node.

27. A sensor comprising a bidirectional node, wherein the sensor is configured to communicate sensor data in a serial data signal at the bidirectional node and to store the sensor data in response to a trigger signal received at the bidirectional node.

* * * * *